United States Patent [19]

McLaughlin et al.

[11] Patent Number: 4,764,801
[45] Date of Patent: Aug. 16, 1988

[54] POLY-SIDEWALL CONTACT TRANSISTORS

[75] Inventors: Kevin L. McLaughlin, Chandler; Thomas P. Bushey, Phoenix, both of Ariz.

[73] Assignee: Motorola Inc., Schaumburg, Ill.

[21] Appl. No.: 58,637

[22] Filed: Jun. 3, 1987

Related U.S. Application Data

[63] Continuation of Ser. No. 785,415, Oct. 8, 1985, abandoned.

[51] Int. Cl.⁴ .................... H01L 29/04; H01L 29/72; H01L 27/12; H01L 23/48
[52] U.S. Cl. .................................. 357/59; 357/34; 357/49; 357/54; 357/65
[58] Field of Search ............... 357/47, 49, 50, 54, 357/65, 59, 34, 92

[56] References Cited

U.S. PATENT DOCUMENTS

| 3,189,973 | 6/1965 | Edwards et al. | 357/34 |
| 4,216,491 | 8/1980 | Matsuda et al. | 357/49 |
| 4,396,933 | 8/1983 | Magdo et al. | 357/59 |
| 4,499,657 | 2/1985 | Ooga et al. | 357/59.H |

FOREIGN PATENT DOCUMENTS 59-126671 7/1984 Japan .................... 357/34

OTHER PUBLICATIONS

V. J. Silvestri et al., "Integrated Circuit Processing Concept," *IBM Technical Disclosure Bulletin*, vol. 22, (Apr. 1980) pp. 5155–5156.
T. Nakamura et al., "Self-aligned transistor with Sidewall Base Electrode," *IEEE International Solid-State Circuit Conference*, 2/20/81, pp. 214–15.
T. Nakamura et al., "Self-aligned Transistor with Sidewall Base Electrode," *IEEE Trans. on Electron Devices*, vol. ED-29, No. 4, Apr. 1982, pp. 596–600.
T. Nakamura et al., "High Speed IIL Circuits Using a Sidewall Base Contact Structure," *IEEE Jour. of Solid-State Circuits*, vol. SC-20, No. 1, Feb. 1985, pp. 168–172.
D. D. Tang et al., "A Symmetrical Bipolar Structure," *IEEE Electron Devices Meeting*, Dec. 8–10, 1980, pp. 58–60.
C. Cohen, "Upwardly Operating Bipolar Transistors Increase Efficiency," *Electronics*, Sep. 22, 1982, pp. 85–86.

Primary Examiner—J. Carroll
Attorney, Agent, or Firm—Robert M. Handy

[57] ABSTRACT

Improved semiconductor devices having minimum parasitic junction area are formed by using multiple buried polycrystalline conductor layers to make lateral contact to one or more pillar-shaped epitaxial single crystal device regions. The lateral poly contacts are isolated from each other and from the substrate and have at least one polycrystalline pillar extending to upper surface of the device to permit external connections to the lowest poly layer. The lateral epi-poly sidewall contacts are recessed under the intervening oxide layers to separate them from the active device regions in the center of the epi pillar. The structure is made by depositing three dielectric layers with two poly layers sandwiched in between. Holes are anisotropically etched to the lowest poly layer and the substrate. The exposed edges of the poly layers are oxidized. These edge oxide regions are removed in the holes where the device pillars are epitaxially grown. The remaining edge oxide regions isolate the buried conductor layers, contacts, and isolation walls. The polycrystalline pillar extending from the lowest poly layer to the device surface is formed at the same time as the epi-pillar. The structure is self-aligned and self-registering.

7 Claims, 7 Drawing Sheets

POLY-SIDEWALL CONTACT TRANSISTORS

This application is a continuation of application Ser. No. 785,415, filed Oct. 8, 1985, abandoned.

BACKGROUND OF THE INVENTION

1. Field of the Invention

This invention relates in general to electronic devices and, more particularly, to improved means and methods for providing small high performance devices with sidewall contacts, suitable for use in large scale integrated circuits.

2. Background Art

There is an ongoing desire in the semiconductor art to produce transistors having smaller and smaller dimensions. This is because, in many applications, faster performance, lower power dissipation, and/or more complex circuits can be obtained with smaller devices. It is generally also desired that the individual devices be electrically isolated one from the other.

With high speed low power bipolar transistors and integrated circuits, for example, the individual devices are usually isolated by a combination of junction isolation and oxide filled trenches in the semiconductor substrate. Typically, metallic interconnects are made to emitter, base, and collector contact regions on the upper surface of the active portions of the device. Minimum device size is usually limited by the minimum lithographic dimensions, the need for providing alignment tolerance among the successive mask layers, and the need for providing contacts on the device surface.

While the available device structures and methods permit very complex integrated circuits to be fabricated, they still suffer from a number of significant limitations. For example, in a typical planar bipolar transistor the base-collector junction area and the collector-substrate junction area are larger than is necessary merely for the desired transistor action because of the need to provide room on the upper surface of the device for the contact regions. These larger than desired junction areas can introduce unwanted parasitic capacitance which limits the device or circuit performance. The larger areas can also limit the attainable packing density and circuit complexity.

A partial solution to this problem has been suggested in the prior art by use of "pillar" transistors employing lateral polycrystalline base contacts. However, these prior art structures still suffer from excessive collector-substrate capacitance and are not easily interconnected because they have a substrate collector contact. Thus, a need continues to exist for device structures and fabrication methods which overcome or avoid one or more limitations of the prior art.

Accordingly, it is an object of the present invention to provide improved means and methods for fabricating minimum geometry semiconductor devices which have reduced base-collector and collector-substrate junction areas.

It is an additional object of the present invention to provide improved means and methods for forming semiconductor devices in which electrical connections to the buried active device regions are made laterally.

It is a further object of the present invention to provide improved means and methods for forming bipolar transistors using buried sidewall contacts to base and collector regions.

It is additional object of the present invention to provide improved means and methods for providing device structures which can be individually isolated.

It is a further object of the present invention to provide improved means and methods for fabricating devices in which the device active areas, contacts, and isolation walls are self-aligned and whose dimensions and separations are controlled by a single masking layer.

It is an additional object of the present invention to provide improved means and methods for interconnecting devices and device regions using isolated buried conductor layers formed at the same time as the lateral device contacts.

As used herein, the words "polycrystalline" or "poly" are intended to include all non-single crystal forms of solids. As used herein, the words "dip etching" are intended to include all forms of blanket etching or erosion, and are not intended to be limited merely to wet chemical etching.

SUMMARY OF THE INVENTION

The attainment of the foregoing and other objects and advantages is achieved through the present invention wherein there is provided a single crystal substrate, a pillar of single crystal semiconductor material having a lower surface resting on the substrate, an upper surface away from the substrate, and a sidewall therebetween, and having at least first and second device regions extending laterally through the single crystal pillar to the sidewall. A first substantially horizontal polycrystalline conductor region which is electrically isolated from the substrate is provided for contacting the first device region of the single crystal pillar at the sidewall and having an extension to the upper surface of the device. A second substantially horizontal polycrystalline conductor region which is electrically isolated from the substrate and from the first polycrystalline conductor region contacts the second device region of the single crystal pillar at the sidewall. Substantially horizontal dielectric layers are provided between the substrate and the first and second polycrystalline conductor layers. The single crystal pillar has lateral extensions at the places where it meets the polycrystalline conductor layers, these lateral extensions protrude outwardly underneath the dielectric layers intervening between the polycrystalline conductor layers. These protrusions insure that the poly-single crystal interfaces are laterally separated from the central portion of the pillar. Isolation is provided by dielectric regions formed at the edges of the horizontal buried polycrystalline conductor layers where they meet vertical conductors, and by the intervening horizontal dielectric layers. The buried polycrystalline conductor layers and the single or polycrystalline pillars provide additional interconnect means for electrically connecting different devices and/or device regions.

A third device region is provided in the upper surface of the pillar. A dielectric layer is provided over the second polycrystalline conductor region. Contact holes are provided in this dielectric layer for making electrical contact to the third device region on the top of the single crystal pillar, and to the second polycrystalline conductor layer and the extension of the first polycrystalline conductor layer on the upper surface.

The foregoing and other objects and advantages are further achieved through the present invention wherein there is provided a process for forming sidewall contact semiconductor devices comprising: providing a semiconductor substrate having thereon superposed layers of a first dielectric, a first polycrystalline conductor, a second dielectric, a second polycrystalline conductor and a third dielectric, wherein the third dielectric has an outer surface; forming on the outer surface a first masking layer having first, second and third openings above first, second and third portions respectively of each of the substrate, the first, second and third dielectric layers and the first and second polycrystalline conductor layers; using this first mask layer, removing first, second and third portions of the third dielectric layer exposing first, second and third portions of the second polycrystalline conductor layer; forming a second masking layer covering the third portion of the second polycrystalline conductor layer, removing the first and second portions of the second polycrystalline conductor layer and second dielectric layer thereby exposing the first and second portions of the first polycrystalline conductor layer; thereafter, providing a third masking layer covering the second portion of the first polycrystalline conductor layer, removing the first portion of the first polycrystalline conductor layer and the first portion of the first dielectric layer; removing any remaining parts of the first, second and third masking layers; thereafter, partly oxidizing the first portion of the substrate, the second portion of the first polycrystalline conductor layer, the third portion of the second polycrystalline conductor layer and first edge portions of the first and second polycrystalline conductor layers which are exposed under the first opening and second edge portions of the second polycrystalline conductor layer which are exposed under the second opening; then in either order (a) providing a fourth masking layer having a fourth opening larger than the first opening above the first portion of the substrate and isotropically etching through the fourth opening to expose the first portion of the substrate and the edge portions of the first and second polycrystalline conductor layers, and (b) thereafter providing a fifth masking layer having a fifth opening larger than the first opening and located above the second portion of the first polycrystalline conductor layer and anisotropically etching through the fifth opening to expose the second portion of the first polycrystalline conductor layer while leaving substantially in place the oxide on the second edge portion of the second polycrystalline conductor layer; thereafter removing any remaining portions of the fourth or fifth masking layer; then forming a single crystal conductor region above the first portion of the substrate and in contact with the first edge portion of the first and second polycrystalline conductor layers, and forming a polycrystalline conductor contact region above the second portion of the first polycrystalline conductor layer; forming a device in the single crystal conductor region; and providing electrical connections to the third portion of the second polycrystalline conductor region, the single crystal semiconductor region and the polycrystalline conductor contact region.

An NPN bipolar transistor is conveniently obtained by providing N-type doping in the lower portion of the single crystal region to form a collector in contact with the first polycrystalline conductor layer, providing P-type doping in the middle portion of the single crystal region to form a base in contact with the second polycrystalline conductor layer, and providing N-type doping at the upper surface of the single crystal semiconductor region to form an emitter. Lateral dielectric spacers are optionally used at the periphery of the upper surface of the single crystal region so that the emitter can be implanted centrally in the single crystal region without an additional masking step.

The portions of the first and second polycrystalline conductor layers located between the isolated devices provide buried interconnections for wiring together the individual isolated devices and are conveniently formed simultaneously with the device region and contacts. The process uses a single masking layer to locate the active regions of the device, the contacts, the isolation regions surrounding the device, and the buried interconnection and contacts thereto. This is a substantial advantage. The polycrystalline conductors are conveniently formed of silicon, but other semiconductors, silicides, intermetallics or combinations thereof can also be used. The polycrystalline conductors must withstand the processing necessary to form the single crystal pillar for the active device regions.

DETAILED DESCRIPTION OF THE DRAWINGS

For purposes of explanation, the device structures illustrated herein are shown as bipolar devices having particular combinations of N and P layers. However, those of skill in the art will understand that these device structures and doped layer combinations are presented merely as an aid to understanding and are not intended to be limiting, and that other combinations of N and P layers or regions and other device types can equally well be used and fabricated according to the teachings of the present invention. The invented means and method applies to any structure requiring multiple sidewall contacts to device regions and/or multiple buried conductor layers for interconnections or other purposes. The contacts may be ohmic, rectifying, or injecting.

Figure 1A:
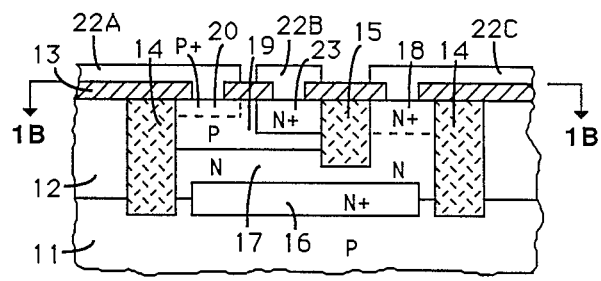
FIGS. 1A–C show simplified schematic cross-sectional side and top views of a portion of a semiconductor device according to the prior art.
Figure 1B:
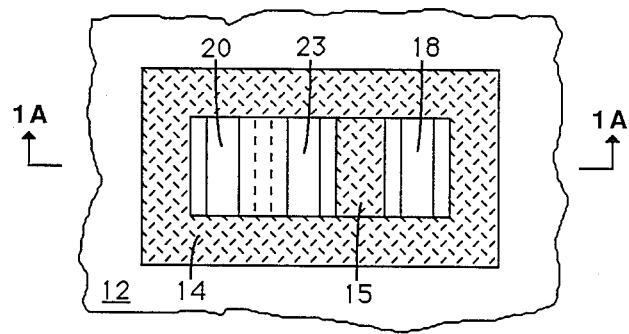

FIGS. 1A–B show in schematic form simplified cross-sectional side and plan views of a portion of a typical semiconductor device made according to the prior art. Semiconductor device portion 10 consists of P-type substrate 11 covered by epitaxial layer 12 and having buried N+ region 16, N-type collector region 17, P-type base region 19, N+ emitter region 23, N+ collector contact region 18, P+ base contact region 20 and dielectric layer 13. Dielectric layer 13 is transparent in FIG. 1B. Device portion 10 is surrounded by dielectric isolation wall 14. Collector contact region 18 is separated from emitter 23 by additional dielectric isolation wall 15. Electrical contacts 22a, 22b, and 22c are provided respectively, to base contact region 20, emitter region 23, and collector contact region 18. Means for constructing such devices are well known in the art.

Figure 1C:
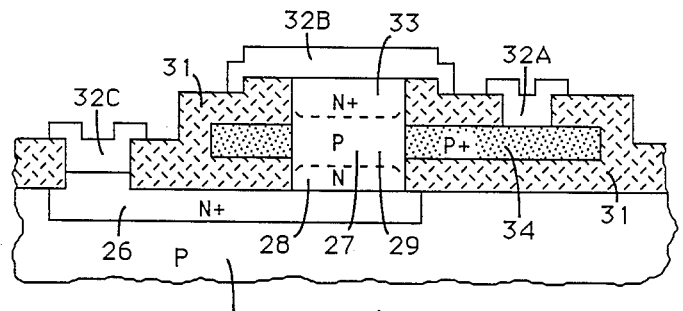

FIG. 1C shows a simplified schematic cross-sectional side view of another bipolar device structure known in the prior art. Device portion 30 consists of substrate 21 in which has been placed buried collector region 26. Dielectric layer 31 surrounds pillar-like single crystal device region 27 consisting of collector portion 28, base portion 29, and emitter portion 33. In contrast to the structure of device portion 10 of FIG. 1A, base portion 29 of device 30 of FIG. 1C does not extend directly to the upper surface of device 30. Rather, contact to base portion 29 is made by means of P+ polycrystalline silicon layer 34 which contacts base portion 29 of single crystal device region 27 at its lateral periphery. Electrical contacts to device 30 are provided by metal 32a which contacts poly region 34, metal 32b which contacts emitter 33, and metal 32c which contacts buried collector region 26.

A deficiency of the structure of FIG. 1A is that extending the active base and collector regions to accommodate contacts on the upper surface increases the base-collector junction and the collector-substrate junction area. The structure of FIG. 1C provides some improvement since no additional base-collector junction area is needed to accommodate the base contact. However, the structure of FIG. 1C does not substantially reduce the collector-substrate junction area. Among other things, the larger collector-substrate junction area can degrade the device performance and increase device size. Further, isolation and step coverage are more difficult because the collector contact is on the substrate.

These and other problems are overcome by the structure of FIGS. 2A-D, according to the present invention. FIGS. 2A-D show simplified schematic cross-sections of device portion 40 comprising substrate 41 with superposed layers 42-46. Penetrating through layers 42-46 is single crystal pillar 49 in which has been formed N+ buried collector 49a, N-type collector region 49b, P-type base region 49c and N+ emitter region 49d. Electrical contacts to collector region 49a-b and base region 49c are made internally at the periphery of single crystal pillar 49 by poly regions 43 and 45, respectively. Poly regions 43 and 45 are isolated from substrate 41 and/or from each other by dielectric regions 42, 43a, 44, and 45a-b. Also penetrating through layers 42-46 is single crystal or dielectric region 59. Single crystal or dielectric region 59 is separated from polycrystalline regions 43 and 45 by dielectric regions 43a and 45a respectively.

Polycrystalline collector contact 43 consists of comparatively thin lateral contact portion 47a which contacts single crystal device pillar 49 and polycrystalline pillar portion 47b which connects lateral contact portion 47a to external collector contact 50c. Polycrystalline base contact region 45 consists of comparatively thin lateral contact portion 48a and, optional vertical portion 48b extending to external base contact 50a. Vertical portion 48b may be formed as a part of external contact 50a as shown, for example, in FIG. 3F. External contact 50b contacts N+ emitter region 49d of single crystal device region 49.

Figure 2A:
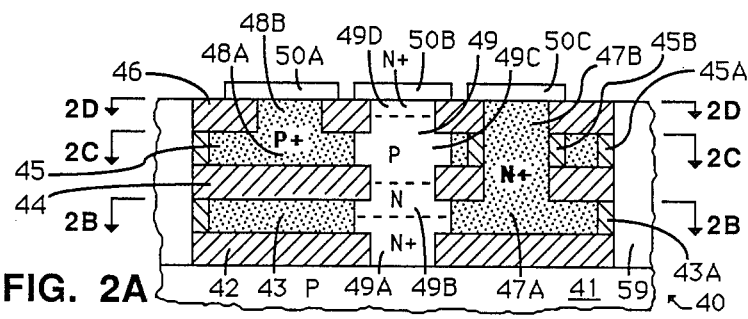
FIGS. 2A–D show simplified schematic cross-sectional side and plan views of a portion of a semiconductor device according to the present invention.
Figure 2B:
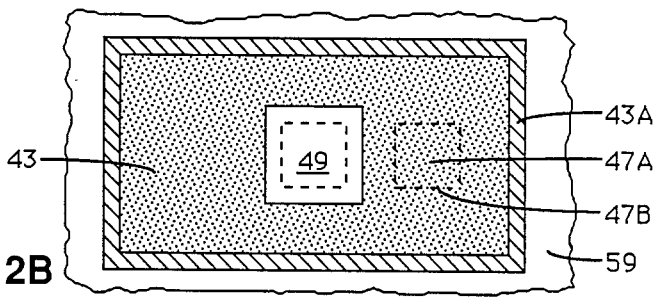
Figure 2C:
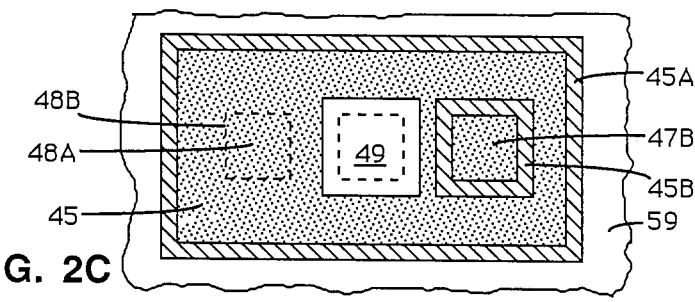
Figure 2D:
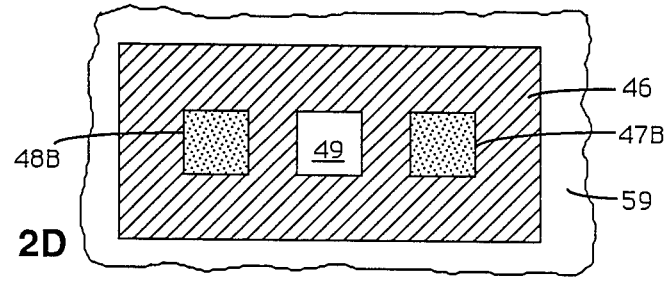

FIGS. 2B-D show, in simplified schematic form, planar cross-sectional views through the structure of FIG. 2A at different levels within the structure. For ease of understanding, in FIGS. 2B-D single crystal regions are shown as clear, dielectric regions are shown hatched, and polycrystalline conductor regions are shown stippled. In FIGS. 2B-C, the locations of pillar or contact portions 47b and 48b above lateral contact portions 47a and 48a are shown by dashed lines. Isolation wall 59 is shown as being single crystal but it could also be dielectric or polycrystalline or a combination thereof.

The structure of FIGS. 2A-D has reduced base-collector junction area and reduced collector-substrate junction area because single crystal active device region 49 need only be large enough to provide the necessary drive current and need not have additional area to accommodate planar contacts, since both base and collector contacts are made laterally by poly layers 43 and 45. This combination of structural features reduces the parasitic capacity and series base resistance associated with the device and therefore permits improved performance with no increase in device area. It will be apparent to those of skill in the art that while the structure is illustrated in terms of a bipolar transistor having collector, base, and emitter, that other device types using buried lateral contacts can also be formed. For example, by omitting the P-type base doping in region 49c so that P+ poly region 48a directly contacts the N-doped portion of pillar 49 and by extending pillar 49 vertically in FIG. 2B so that it intersects isolation wall 43a so as to split poly region 48a into two parts, one on either side of pillar 49 rather than surrounding pillar 49a lateral PNP transistor may be formed. Sufficient P-type dopant will out-diffuse into N-doped pillar 49 to form PN junctions at each side of pillar 49. The two split parts of P+ region 48a form the emitter/collector contacts and pillar 49 forms the base of the lateral PNP.

A further feature of the structure of FIGS. 2A-D is that the interfaces between poly regions 43, 45 and single crystal region 49 are recessed under dielectric layers 46 and 44 so as not to interfere with the device action which occurs primarily in the central portion of single crystal region 49. This results in improved device performance.

FIGS. 3A-K show cross-sectional views in simplified schematic form, but in greater detail, of the device of FIGS. 2A-D at different stages of fabrication, and according to several embodiments. The fabrication sequence is illustrated as for an NPN bipolar transistor, but those of skill in the art will understand that other dopants could be used and that other devices structures or device types could equally well be fabricated following the principals taught herein with appropriate modifications of the doping types and locations.

Figure 3A:
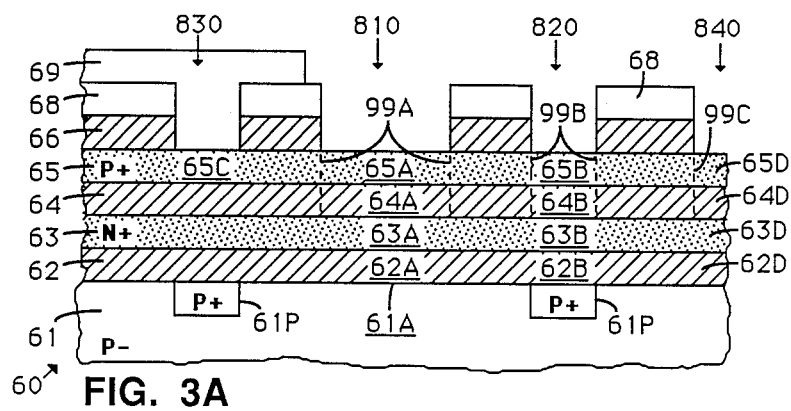
FIGS. 3A–K shows simplified schematic cross-sectional views of a portion of the semiconductor device of FIGS. 2A–D at different stages of fabrication and according to different embodiments.

As shown in FIG. 3A, device portion 60 comprises P-type substrate 61 having therein P+ channel-stop regions 61p. Device portion 60 of FIG. 3A is analagous to device portion 40 of FIG. 2A as are the individual regions. Substrate 61 is covered by dielectric layer 62, N+ polycrystalline conductor layer 63, dielectric layer 64, P+ polycrystalline conductor layer 65, and dielectric layer 66. Layers 62-66 are preferably deposited and/or formed sequentially without any intervening masking operations. This makes it possible to prepare layers 62-66 with a high degree of uniformity and perfection. This contributes substantially to obtaining a high manufacturing yield and is a feature of the present invention.

Dielectric layers 62, 64, and 66 must be electrical insulators. It is also important that dielectric layers 62, 64, and 66 be stable so as not to decompose or exude contaminants during formation of pillars 90 and 92 (FIG. 3E). Further, layers 62 and 64 must act as diffusion barriers to prevent interdiffusion and shorting of conductor layers 63 and 65 and of substrate 61 during formation and subsequent processing. Dielectric layers 62, 64, and 66 may be of, for example, silicon oxide, nitride, or combinations thereof, but other dielectric materials can also be used. Silicon oxide and silicon nitride are preferred. Typical thicknesses are 0.02 to 0.4 microns of $SiO_2$ for layer 62, 0.2 to 0.3 microns of $SiO_2$ for layer 64, and a sandwich of 0.05 to 0.3 microns of silicon nitride covered by an outer layer of 0.05 to 0.3 microns of silicon oxide for layer 66. This combination for layer 66 provides better deposition selectivity during subsequent growth of epi pillar 90 and poly pillar 92, and promotes a good epi-dielectric interface near critical junctions formed at or near the top of the pillar 90, as for example near the emitter-base junction of a bipolar transistor.

Layers 63 and 65 must be of conductive materials sufficiently stable to withstand the processing required to form pillars 90 and 92 without introducing undesirable contamination into the active device region or without decomposing or melting. Doped polycrystalline silicon is suitable but other conductive materials such as for example metals, silicides or intermetallics can also be used, provided they have the above described properties. Those of skill in the art will understand how to select suitable materials without undue experimentation. For doped polysilicon, thicknesses in the range 0.05 to 0.5 microns are suitable, with 0.1 to 0.3 microns being preferred. Dielectric layers 62, 64, 66 and polycrystalline layers 63, 65 are formed by means well known in the art. Chemical vapor deposition, plasma assisted chemical vapor deposition, and sputtering are examples of suitable techniques for forming layers 62–66.

Dielectric layer 66 is covered by mask 68 in which are formed openings 810, 820, 830, and 840. Mask 68 is formed by means well known in the art. Openings 810–840 are used to etch corresponding openings 810–840 in dielectric layer 66, exposing the upper surface of portions 65a–d of layer 65. Mask 58 with openings 810–840 constitutes a master mask, in the sense that openings 810–840 determine the location of the active device regions (e.g. emitter, base, collector) under opening 810, the external collector contact region under opening 820, the external base contact region under opening 830, and the surrounding isolational region under opening 840. If buried interconnections are also desired their locations and configurations may also be included in mask 68. Accordingly, the important device and circuit regions are self-aligned and self-registering. This is feature of the present invention.

Mask 69 is provided so as to cover opening 830 above portion 65c of polycrystalline layer 65. Mask 68 may but need not be left in place since its image has already been transferred to layer 66 which can serve as a mask for subsequent steps. Mask 69 does not require a precision alignment since its function is merely to block opening 830. Using the combination of openings from masks 68 and 69, portions 65a, 65b, and 65d of layer 65, and portion 64a, 64b, and 64d of layer 64 are removed as indicated by dashed lines 99a–c, so as to expose portions 63a, 63b, and 63d of polycrystalline layer 63 (FIG. 3A). It is desirable that the above-noted portions of layers 64 and 65 be removed by anisotropic etching so as to produce relatively straight sided openings as indicated by dashed lines 99a–c. Reactive ion etching and ion milling are suitable.

Figure 3B:
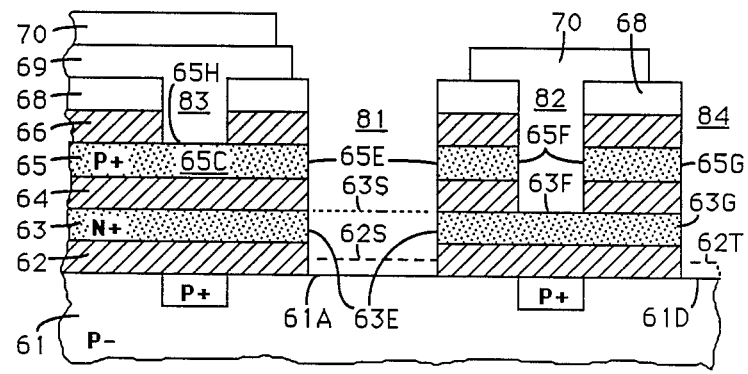

Mask 70 is then applied covering hole 82 formed under opening 820 (FIG. 3B). Mask 70 may be applied without removing masks 68 and 69, or one or both may be removed prior to applying mask 70. If mask 69 is removed, then mask 70 must cover hole 83 formed under opening 830 as well as hole 82. Portions 63a and 63d of layer 63, and portions 62a and 62d of layer 62 are removed to expose portions 61a and 61d of substrate 61 under openings 810 and 840 (FIG. 3B). Alternatively, only part of portions 62a and 62d of layer 62 are removed so that some parts of layer 62 continue to remain above portions 61a and 61d, as indicated by dashed lines 62s and 62t (FIG. 3B).

Any remaining portions of masks 68, 69, and 70 are then removed. At this point in the process, the following openings have been created: hole 81 under opening 810 extending to substrate portion 61a or alternatively to level 62s of layer 62; hole 82 under opening 820 extending to surface 63f of layer 63; hole 83 under opening 830 extending to surface 65h of portion 65c of layer 65; and hole 84 under opening 840 extending to portion 61d of substrate 61 or, alternatively, to level 62t of layer 62. As a consequence edges or sides 63e and 65e of poly layers 63 and 65 are exposed in hole 81, edges or sides 63g and 65g of poly layers 63 and 65 are exposed in hole 84, surface 63f of layer 63 and edge or side 65f of layer 65 are exposed in hole 82, and surface 65h of layer 65 is exposed in hole 83. Portions 61a and 61d of substrate 61 are exposed in holes 81 and 84 respectively, or optionally covered with thin dielectric portions 62s and 62t.

The structure with holes 81–84 is then treated, preferably by exposure to an oxidizing or nitriding atmosphere, so as to convert the near surface regions of the exposed portions of the substrate and the poly layers to a dielectric. Where substrate 61 and poly layers 63 and 65 are silicon this is conveniently accomplished by oxidation or nitriding at about 1000° C. Those of skill in the art will understand that different oxidation or treatment conditions may be required for other materials. Also other treatment conditions, as for example, anodic oxidation could also be used. This step forms (FIG. 3C) dielectric regions 81b on edges 63e, dielectric regions 81c on edges 65e, dielectric region 82b on surface 63f, dielectric regions 82c on edges 65f dielectric regions 84a on surface 61d, dielectric regions 84b on edges 63g, dielectric regions 84c on edges 65g, and dielectric region 83c on surface 65h. Accordingly, it is desirable that the materials used for polycrystalline conductor layers 63 and 65 be such that their exposed edges can be converted to electrically insulating dielectrics of suitable thickness by chemical processes taking place below the melting point of the substrate material, the dielectric layers and/or the polycrystalline conductor materials.

Dielectric regions 81a–c and 82b, and optionally dielectric region 84a, are then removed while dielectric regions 82c, 84b–c and 83c are left in place. This is conveniently accomplished in two steps using masks 71 and 72. Masks 71 and 72 may be applied in either order. It is preferable to use mask 71 first, i.e. before region 81a is removed, since this avoids placing mask 71 directly on region 61a of substrate 61 and so avoids generating surface defects which can result from such contact. Surface defects degrade the quality of the epi region subsequently grown thereon.

Mask 71 is applied (FIG. 3C) to cover holes 81 and 83, and having opening 850 exposing hole 82 and, optionally, hole 84. Mask 71, need not be precision aligned and hole 850 may be larger than hole 82 and (optionally)

larger than hole 84. Using mask 71, dielectric region 82b in the bottom of hole 82 is removed and, optionally, dielectric region 84a in the bottom of hole 84 is removed, without removing dielectric regions 82c and 84b–c on the edges of polycrystalline layers 65 and 63. This is conveniently accomplished using anisotropic etching techniques well known in the art. Ion milling and reactive ion etching are suitable. The upper surface of layer 66 may be partially eroded during this anisotropic etching step. However, sufficient thickness is left to protect dielectric regions 82c and 84b–c. Where regions 82c and 84b–c are of oxide and layer 66 is an oxide-nitride double layer, a selective etch may be used so that the nitride portion of layer 66 remains unetched. Alternatively, the thickness and etch amounts may be adjusted to that some oxide remains as a part of layer 66 above the nitride after etching is complete.

Figure 3C:
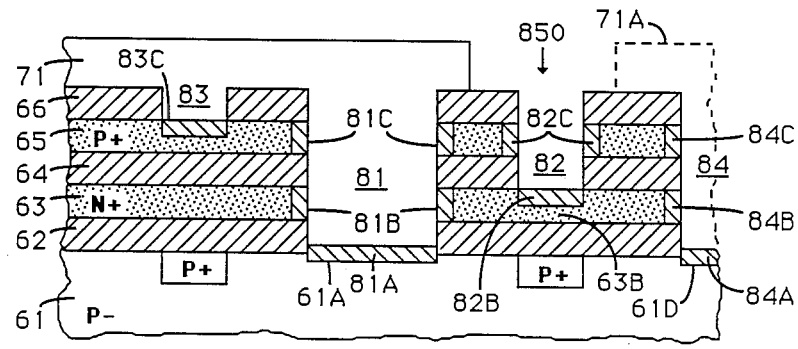
Figure 3D:
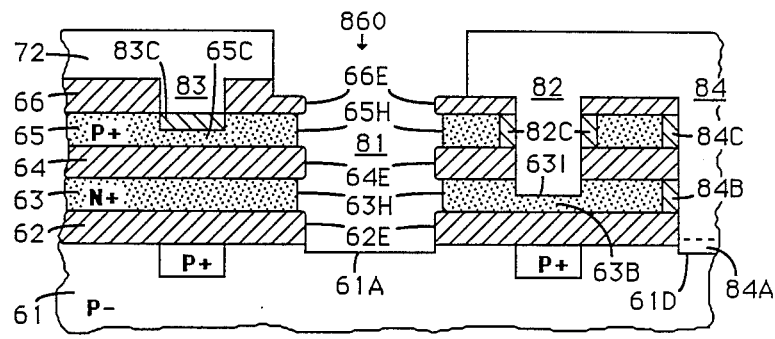
Figure 3E:
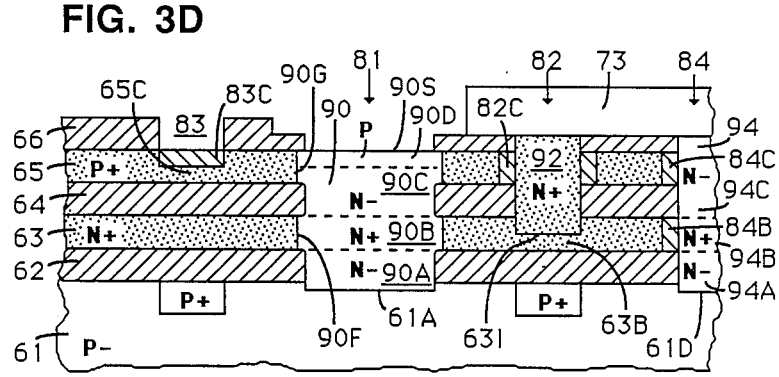

Mask 71 may optionally include mask portion 71a covering hole 84, as indicated by the dashed lines in FIG. 3C. In this case, the above-described anisotropic etching step removes dielectric region 82b in the bottom of hole 82 but leaves in place dielectric region 84a in the bottom of hole 84. As will be subsequently explained, this variation can be utilized, for example, when it is desired to subsequently fill hole 84 with dielectric material.

It is desirable that mask 71 cover hole 81 during the removal of dielectric regions 82b and 84a, so that surface portion 61a of substrate 61 not be adversely affected by the anisotropic etching process used to remove region 82b. It is known, for example, that anisotropic etching-ean increase the surface defect density of single crystal materials. This is undesirable in region 61a since region 61a of substrate 61 is the substrate portion upon which the active device pillar will be epitaxially grown. The existence of surface damage in region 61d, by comparison, is of little consequence since no active device regions are formed above 61d.

Mask 72 is applied having opening 860 located above hole 81. Opening 860 may be larger than opening 810 and hole 81 and need not be precision aligned therewith since the function of mask 72 is to cover holes 82, 83, and 84. Using mask 72, dielectric regions 81a–c are removed, preferably by a mild dip etch or other form of isotropic selective etching, so as to produce the structure shown in FIG. 3D without introducing defects in the surface of region 61a.

Figure 3F:
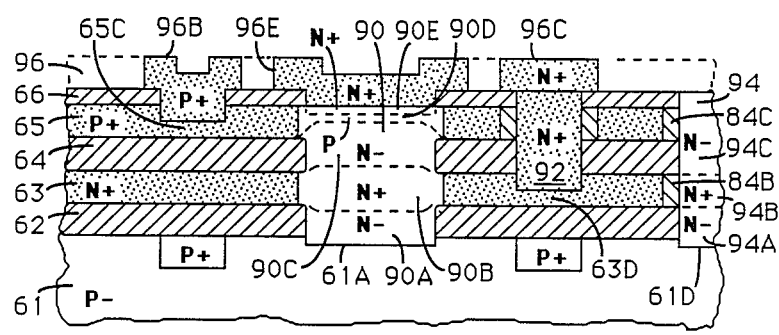

While dielectric regions 81a–c are being removed (FIGS. 3C–D) some etching of exposed dielectric edges 62e, 64e, and 66e will also occur. However, it has been observed that oxide regions 81b–c are typically less dense than oxide layers 62, 64, 66 and therefore etch more rapidly so that oxide edges 62e, 64e, and 66e continue to overhang poly edges 63h and 65h. In any case, if excessive etching of dielectric edges 62e, 64e, and 66e occurs, then a brief selective etch of poly edges 63h and 65h will restore the dielectric overhang. The dielectric overhang is desirable since it keeps the epi-poly interface back under edges 64e and 66e so that the dislocated semiconductor material at the poly-epi interface does not interfere with device operation in single crystal pillar 90 (FIGS. 3E–F).

Any remaining portions of masks 71 and 72 are removed. At this point in the process, hole 83 extends to dielectric region 83c, hole 81 extends to region 61a of substrate 61, hole 82 extends to surface 63i of poly layer 63, and hole 84 extends to dielectric region 84a or to region 61d of substrate 61.

The partially completed device is placed in an epitaxial reactor or other suitable deposition apparatus and exposed to a semiconductor bearing gas or particle stream under conditions suitable for the growth of single crystal region 90 above portion 61a of substrate 61, optional single crystal region 94 above portion 61d of substrate 61, and polycrystalline region 92 on surface 63i above region 63b of polycrystalline layer 63 (FIG. 3E). The epitaxial growth conditions are preferably adjusted so that significant nucleation does not take place on the exposed dielectric surfaces, i.e. on layer 66, region 83c, and, if present, region 84a. FIG. 3E illustrates the situation where dielectric region 84a had been removed and portion 61d exposed. Means and methods for performing such depositions are well known in the art.

To form an NPN bipolar transistor, it is desirable that substrate 61 be P-type and that deposited semiconductor regions 90, 92, and 94 by N-type. This is conveniently accomplished by providing N-type doping during the growth of single crystal regions 90, 94 and polycrystalline region 92. By adjusting the growth conditions, polycrystalline region 92 may be made to grow more slowly or more rapidly than single crystal regions 90, 94. In the example shown in FIG. 3E, conditions are adjusted so that polycrystalline region 92 grows slightly more slowly than single crystal regions 90 and 94 so that the upper surfaces of single crystal regions 90, 94 and polycrystalline region 92 are approximately level after growth is completed. However, this is not essential. It has been found that epitaxial growth using a mixture of dichlorosilane at 300–800 cc/min, hydrogen at 120–180 l/min, and hydrogen chloride at 1–2% of the hydrogen rate, at 925°–1050° C., gives a silicon growth rate of 0.05–0.3 microns/min with a poly to single crystal growth rate ratio of about 0.6–0.8/1. A hydrogen prebake at about 50 Torr at 1000°–1100° C. is desirable.

It is desirable but not essential that the doping be varied during growth of regions 90, 92 and 94 so as to first form N− regions 90a, 94a, then N+ regions 90b, 94b, then N− regions 90c and 94c. N− region 90c may extend to surface 90s of epitaxial pillar 90. P region 90d is formed in the upper portion of epitaxial pillar 90, preferably by ion implantation after completion of epi growth (FIG. 3E). However, P-type region 90d may also be formed by introducing P-type dopants during the final stages of the epitaxial growth process, but this is less desirable.

Holes 81, 82, and 84 need not be completely filled by semiconductor material 90, 92, and 94, respectively (FIG. 3E). It is only necessary that surface 90s of pillar 90 extend to or above the level of P+ polycrystalline layer 65 so that contact is obtained at the periphery of epitaxial pillar 90 between P region 90d and P+ lateral poly contact 65. Where ion implantation is used to create P-type region 90d, mask 73 (FIG. 3E) is used to avoid P−type doping of poly region 92 or single crystal region 94. It does not matter whether region 65c of P+ poly layer 65 below hole 83 is doped during formation of P-type region 90d. Also it does not matter whether single crystal region 94 is doped during this step.

Dielectric region 83c at the bottom of hole 83 is then removed (FIG. 3F). This may be conveniently accomplished by isotropic etching which may be performed either before or after removal of mask 73. The etching process should desirably be selective so as to attack dielectric regions in preference to semiconductor regions. Such techniques are well known in the art. Some etching of the upper part of layer 66 can also occur without harm.

Following removal of dielectric region 83c, layer 96 is applied and delineated to provide emitter contact 96e, base contact 96b and collector contact 96c. Layer 96 may be of any suitable conductor, e.g., polycrystalline silicon, silicide, metal, intermetallic, or other semiconductor. Emitter region 90e is formed in P region 90d by any convenient method. This may be accomplished for example by outdiffusion of N+ dopant from portion 96e of poly layer 96. Means for N doping of portions 96c and 96e, and P doping of portion 96b of layer 96 are well known in the art. This may be readily accomplished by providing a mask (not shown) to cover portion 96b and using an N-type implant into portions 96c and 96e, and then providing a mask (not shown) to cover portions 96c, 96e and providing a P-type implant into region 96b. Such techniques are well known. These masking steps need not involve precision alignments since the location of emitter 90e is determined substantially by the location of opening 810 in layer 66.

It will be understood by those of skill in the art that the boundaries between regions 90a, 90b, 90c, and 90d, as indicated by the dashed lines in FIGS. 3E-F, will move slightly as a result of the thermal processing used to accomplish the foregoing steps. This rearrangement of the various junctions and boundaries is indicated in FIG. 3F.

Figure 3G:
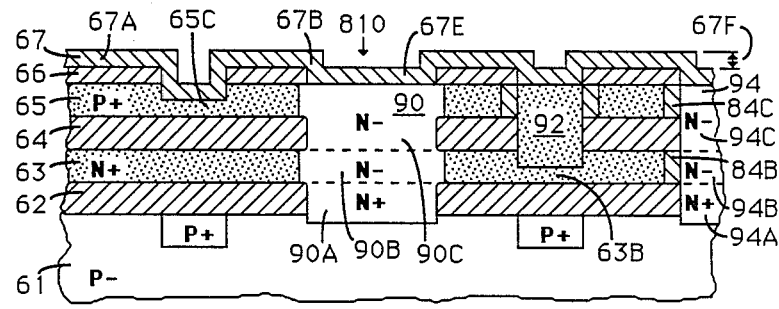
Figure 3H:
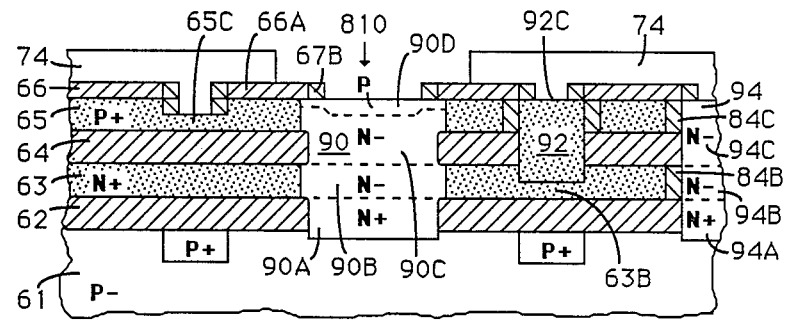
Figure 3I:
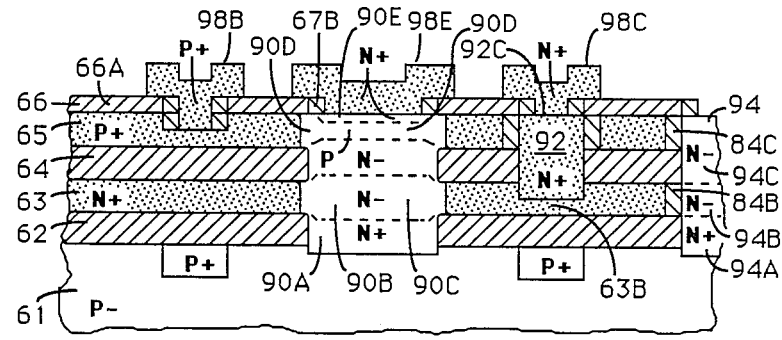

While the structure of FIG. 3F and the process leading thereto provides, for example, an isolated bipolar transistor having lateral sidewall base and collector contacts and--minimum substrate-collector junction area, a further improved structure may be obtained using the alternative process illustrated in FIGS. 3G-I. In FIG. 3G, the structure resulting after the removal of mask 73 and dielectric region 83c is covered by substantially uniform conformal dielectric layer 67. Dielectric layer 67 is conveniently of silicon oxide 0.1-0.5 microns thick. Dielectric layer 67 has portion 67a over the remaining part of layer 66, portion 67e over single crystal region 90 and portion 67b at the step or corner formed between layers 66 and single crystal region 90. Layer 67 is anisotropically etched to remove thickness 67f. This removes portions 67a and 67e but leaves behind portion 67b at the edge of opening 810 in dielectric layer 66 (FIG. 3H). This provides a lateral dielectric spacer at the edge of the opening in layer 66.

FIG. 3H illustrates the situation when base region 90d is formed by implantation after the formation of lateral dielectric spacer 67b. Mask 74 is employed in this process to limit the P-type implant to single crystal region 90. However, this is not essential. P-type region 90d could equally well have been formed as in FIG. 3E using mask 73, i.e. prior to the formation of the lateral dielectric spacer. Lateral dielectric spacer 67b insures that emitter region 90e will be placed in the center of epitaxial region 90 well away from the interface between P+ poly region 65 and P-type base region 90d (FIG. 3I). N+ region 90e may be provided by the same techniques discussed in connection with FIG. 3F. FIG. 3I illustrates the formation of P+ base contact 98b, N+ emitter contact 98e, and N+ collector contact 98c on exposed surface 92c of poly region 92. Contacts 98b, 98e, 98c are formed by means well known in the art.

Figure 3J:
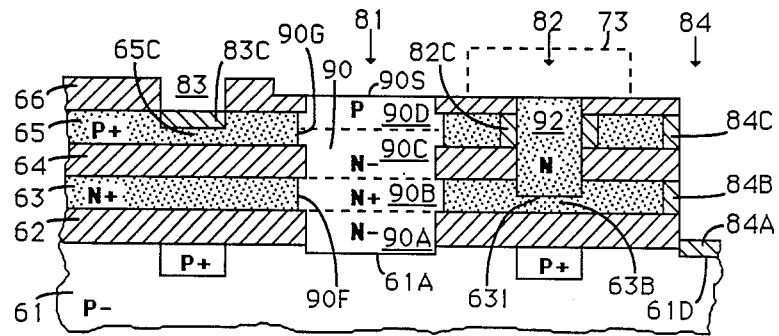
Figure 3K:
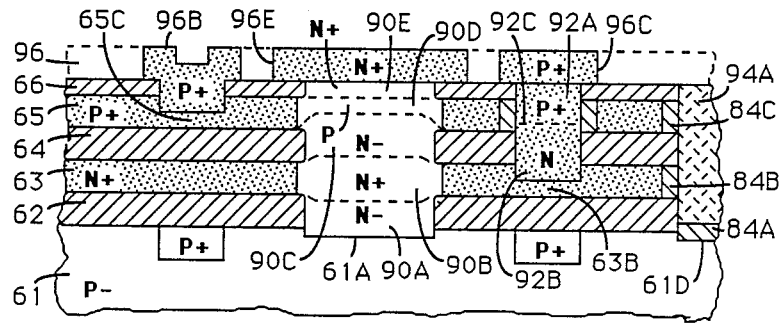

In connection with FIG. 3C it was explained that by including portion 71a in mask 71, that dielectric region 84a was then retained in the bottom of hole 84. When epi region 90 and poly region 92 are formed with that arrangement, using the techniques described in connection with FIG. 3E, the structure of FIG. 3J is obtained. Hole 84 remains substantially free of semiconductor material since semiconductor growth is arranged so that there is little or no nucleation on dielectric surfaces. Hole 84 is then filled with dielectric 94a as illustrated in FIG. 3K. This may be accomplished by use of spin-on glasses, poly deposition and oxidation, or other means well known in the art.

It is frequently desirable to provide an isolated diode in series with the collector of bipolar transistors in integrated circuits. The means and methods of the present invention particularly facilitate providing such diodes. This is illustrated in FIGS. 3J-K wherein a PN diode is formed in poly region 92. In FIG. 3J, mask 73 was optionally used during the formation of P region 90d in the top of column 90, as has been described previously in connection with FIG. 3E. Mask 73 need not cover hole 84. However, mask 73 may be omitted entirely, so that upper portion 92a of poly pillar 92 is P-doped at the same time that region 90d is formed in single crystal pillar 90 (FIG. 3K). While this P-doping is adequate to overcome the N-doping introduced into poly pillar 92 during its growth or deposition, additional N-type doping may up-diffuse into pillar 92 from region 63b of N+ layer 63. This is overcome by providing heavily P-doped contact region 96c of poly layer 96 (FIG. 3K). Region 96c is conveniently formed at the same time as P+ contact region 96b. Contact region 96e is N+ doped to form and/or contact emitter region 90e. Means for forming doped regions 96b, 96c, and 96e are well known in the art and have been described in connection with FIGS. 3F and 3I. PN junction 92c is in series between collector region 90b-c and external contact 96c.

It will be noted that PN junction 92c between P region 92a and N region 92b is transverse to poly pillar 92 and its area is determined by the area of pillar 92. Thus, by varying the area of hole 82, the area of the series PN junction diode may easily be made smaller or larger independent of the size of the device in pillar 90. This is a feature of the present invention and is highly desirable for optimizing circuit performance.

Figure 4A:
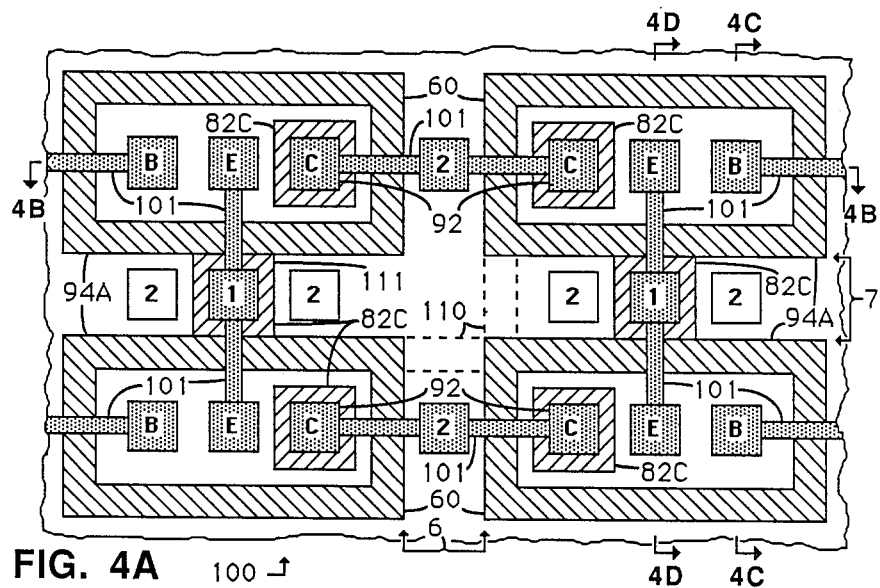
FIGS. 4A–D show simplified schematic plan and side cross-sectional views of an array of interconnected devices according to the present invention.
Figure 4B:
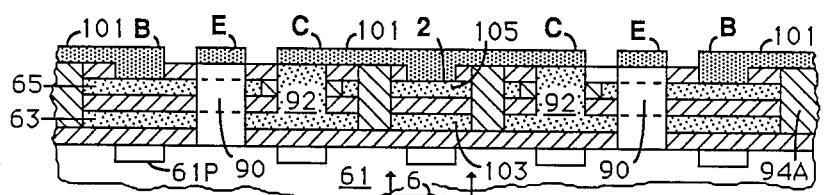
Figure 4C:
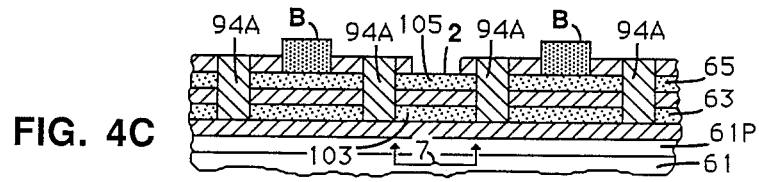
Figure 4D:
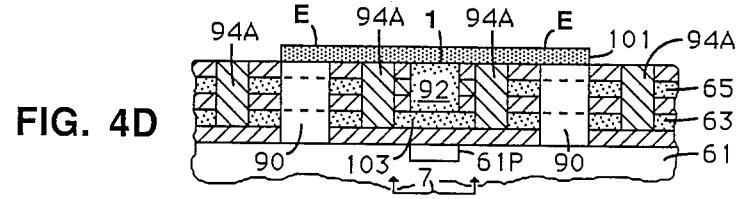

FIGS. 4A-D show in simplified schematic form a plan view (FIG. 4A) and cross-sectional views (FIGS. 4B-D) of interconnected array 100 of devices 60 similar to device 40 of FIGS. 2A-D and/or device 60 FIGS. 3F, 3I, and/or FIG. 3K, showing how the means and methods of the present invention can be used to automatically provide isolated buried self-aligned wiring channels between individual devices 60. For clarity, some details of the individual devices have been omitted in FIGS. 4A-D. Isolation walls 94a correspond to those shown in FIG. 3K, however, isolation walls of the type shown in FIGS. 3F, or 3I covered with a surface dielectric could equally well be used. The array is illustrated for bipolar devices having emitter contact E, base contact B, and collector contact C. Collector contact C may be of the types illustrated in FIG. 3I or FIG. 3K, i.e., without or with a series diode. Isolation walls 94a surround each device 60 and isolation regions 82c surround each poly pillar 92 and are cross-hatched for clarity. Buried poly layers 63 and 65 are lightly stippled. Surface interconnections 101 are more heavily stippled and may be semiconductor, intermetallic, metal, semimetal or a combination thereof. The number 1 indicates the locations where surface contacts are made to layer 63 and the number 2 indicates the locations where contacts are made to layer 65. FIGS. 4B-D show cross-sections through FIG. 4A at various locations.

Four devices 60, each surrounded by isolation walls 94a are arranged, in this example, in a rectangular array separated by wiring channels 6-7. Collectors C of each device 60 are connected to buried poly conductor portions 105 of layer 65 at locations 2 in wiring channel 6, as can be seen in FIGS. 4A and 4B. Emitters E are connected to buried poly conductor portions 103 of layer 63 at locations 1 in wiring channel 7, as can be seen in FIGS. 4A and 4D. Connections 1 or 2 to layers 63 or 65, respectively, may be brought to the surface at any desired point in either wiring channel. Connection points 1 are formed at the same time and by the same procedure as for forming poly pillar 92 in FIGS. 3E-K. Connection points 2 are formed at the same time and in the same way as connections to region 65c in FIGS. 3E-K. Each layer in the wiring channels may be contacted independently. Wiring channels 6-7 may be made wider or narrower depending on how many connections are desired. Also portions 103 and 105 of layers 63 and 65 may run continuously through wiring channels 6-7 or may be interrupted by extending isolation walls 94a to cut across the channel, as at 110. Upper layer 63 may be interrupted, as at 111, by extending a poly pillar and its surrounding isolation wall 82c entirely across the wiring channel. A feature of the above-described means and method is that the wiring channels and contacts thereto, the isolation walls, and the devices and contacts thereto are all self-aligned and self-registering. This makes possible extremely compact layouts. The arrangement illustrated in FIGS. 4A-D provides an extremely flexible and compact interconnection arrangement for complex integrated circuits.

Having thus described the invention it is apparent that the present invention provides a means and method for constructing isolated devices on a common semiconductor substrate which have minimum parasitic junction areas and further which have multiple lateral sidewall device contacts which are isolated from each other and from the substrate by dielectric regions rather than merely by PN junctions. Further, the described means and methods provides a structure which is self-aligned and self-registering in which all device and buried connections and contact areas are defined by a single master mask layer. The described means and method is particularly suitable for use in high density integrated circuits.

While the invented process has been illustrated in terms of particular combinations of conductivity and device types, those of skill in the art will recognize that these are merely intended to be illustrative, and that the invented means and method can be used in connection with other combinations of conductivity types and other types of devices. For example, but not limited thereto, the means and method of the present invention can be used to make diodes, bipolar transistors, thyristors, lateral transistors, field effect devices, capacitors, and multi-layer interconnections. Accordingly, it is intended to include all such variations within the claims which follow.

We claim:

1. A semiconductor device having sidewall contacts comprising:
   a single crystal substrate;
   a pillar of single crystal semiconductor material having a lower surface epitaxially contacting said substrate, an upper surface away from said substrate, and a sidewall therebetween, and having at least first and second device regions extending laterally through said single crystal pillar to said sidewall;
   a first substantially horizontal polycrystalline conductor region, electrically isolated from said substrate, for contacting said first device region of said single crystal pillar at said sidewall and having a polycrystalline conductor pillar extending to an upper surfaces of said device;
   a second substantially horizontally polycrystalline conductor region, electrically isolated from said substrate and from said first polycrystalline conductor region, for contacting said second device region of said single crystal pillar at said sidewall;
   substantially horizontal first dielectric layer between said substrate and said first polycrystalline conductor region, second dielectric layer between said first and second polycrystalline conductor regions, and third dielectric layer above said second polycrystalline conductor region wherein said first dielectric layer has an upper surface in contact with a lower surface of said first polycrystalline conductor region, said second dielectric layer has a lower surface in contact with an upper surface of said first polycrystalline conductor region, said second dielectric layer has an upper surface in contact with a lower surface of said second polycrystalline conductor region, and said third dielectric layer has a lower surface in contact with an upper surface of said second polycrystalline conductor region; and
   wherein said sidewall of said single crystal pillar has first and second lateral extensions where it meets said first and second polycrystalline conductor regions, said first lateral extension providing a first single crystal region protruding outwardly underneath said second dielectric layer a first distance in contact with said upper surface of said first dielectric layer and a second distance in contact with said lower surface of said second dielectric layer, and said second lateral extension providing a second single crystal region protruding outwardly underneath said third dielectric layer a third distance in contact with said upper surface of said second dielectric layer and a fourth in contact with said lower surface of said third dielectric layer.

2. The device of claim 1 further comprising a third device region in the upper surface of said pillar.

3. The device of claim 2 further comprising contact means on said third dielelectric layer for making electrical contact to said surface of said single crystal pillar, and to said second polycrystalline conductor region and to said polycrystalline conductor pillar.

4. The device of claim 1 further comprising:
   first isolation means formed at lateral edges of said first polycrystalline conductor region away from said single crystal pillar; and
   second isolation means formed at lateral edges of said second polycrystalline conductor region away from said single crystal pillar and at said polycrystalline conductor pillar.

5. A semiconductor device having sidewall contacts comprising:
   a single crystal substrate;
   a pillar of single crystal semiconductor material having a lower surface epitaxially contacting said substrate, an upper surface away from said substrate, and a sidewall therebetween, and having at least first and second device regions extending laterally through said single pillar to said sidewall;

a first substantially horizontal polycrystalline conductor region, electrically isolated from said substrate, for contacting said first device region of said single crystal pillar at said sidewall and having a polycrystalline conductor pillar extending to an upper surfaces of said device;

a second substantially horizontally polycrystalline conductor region, electrically isolated from said substrate and from said first polycrystalline conductor region, for contacting said second device region of said single crystal pillar at said sidewall;

substantially horizontal first dielectric layer between said substrate and said first polycrystalline conductor region, second dielectric layer between said first and second polycrystalline conductor regions, and third dielectric layer above said second polycrystalline conductor region, wherein said sidewall of said single crystal pillar has first and second lateral extensions where it meets said first and second polycrystalline conductor regions, said first lateral extension providing a first single crystal region protruding outwardly underneath said second dielectric layer and said second lateral extension providing a second single crystal region protruding outwardly underneath said third dielectric layer;

first isolation means formed at lateral edges of said first polycrystalline conductor region away from said single crystal pillar;

second isolation means formed at lateral edges of said second polycrystalline conductor region away from said single crystal pillar and at said polycrystalline conductor pillar; and first and second buried polycrystalline conductor layers laterally outside said isolation means, formed at the same time as and coplanar with, respectively, said first and second polycrystalline conductor regions, for interconnecting a multiplicity of said devices.

6. An integrated circuit having an upper surface, comprising:

a single crystal semiconductor substrate;

a plurality of pillar transistors epitaxially contacting said substrate and having sidewall contacts surrounded by one or more isolation regions extending to said upper surface;

conductor layers buried below said upper surface and having first portions located laterally within said one or more isolation regions for providing said sidewall contacts to said pillar transistors, and having second portions formed at the same time as said first portions and substantially coplanar therewith and located laterally outside said one or more isolation regions, wherein at least one of said second portions interconnects contacts to at least two of said plurality of pillar transistors located in separate isolation regions.

7. The integrated circuit of claim 6 wherein said pillar transistors comprise bipolar transistors and said sidewall contacts comprise base and collector contacts or base and emitter contacts of said bipolar transistors.

* * * * *